(12) United States Patent
Vasyltsov et al.

(10) Patent No.: US 9,377,997 B2
(45) Date of Patent: Jun. 28, 2016

(54) RANDOM NUMBER GENERATOR

(71) Applicant: SAMSUNG ELECTRONICS CO., LTD., Suwon-si, Gyeonggi-do (KR)

(72) Inventors: Ihor Vasyltsov, Suwon-si (KR); Bohdan Karpinskyy, Suwon-si (KR); Heonsoo Lee, Hwaseong-si (KR); Yunhyeok Choi, Changwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 232 days.

(21) Appl. No.: 14/148,384

(22) Filed: Jan. 6, 2014

(65) Prior Publication Data

US 2014/0250160 A1    Sep. 4, 2014

(30) Foreign Application Priority Data

Mar. 4, 2013    (KR) .................. 10-2013-0022851

(51) Int. Cl.
  *G06F 7/58*    (2006.01)
  *H03K 3/84*    (2006.01)
(52) U.S. Cl.
  CPC . *G06F 7/588* (2013.01); *H03K 3/84* (2013.01)
(58) Field of Classification Search
  None
  See application file for complete search history.

(56) References Cited

U.S. PATENT DOCUMENTS

| | | | |
|---|---|---|---|
| 6,807,553 B2 | 10/2004 | Oerlemans | |
| 6,862,605 B2 | 3/2005 | Wilber | |
| 6,954,770 B1 * | 10/2005 | Carlson | G06F 7/588 708/251 |
| 7,177,888 B2 | 2/2007 | Wells | |
| 7,797,361 B2 * | 9/2010 | Lazich | G06F 7/588 708/250 |
| 8,024,386 B2 | 9/2011 | Song et al. | |
| 8,131,789 B2 | 3/2012 | Vergnes et al. | |
| 2002/0186086 A1 | 12/2002 | Curiger et al. | |
| 2008/0256153 A1 * | 10/2008 | Park | G06F 7/588 708/251 |
| 2009/0327381 A1 | 12/2009 | Morad | |
| 2010/0281088 A1 | 11/2010 | Wilber | |
| 2011/0169579 A1 | 7/2011 | Dodrill | |
| 2011/0169580 A1 | 7/2011 | Dodrill | |

(Continued)

FOREIGN PATENT DOCUMENTS

| | | |
|---|---|---|
| JP | 2005-044090 | 2/2005 |
| KR | 10-1127961 | 4/2012 |

OTHER PUBLICATIONS

Benjamin Jun, et al., "The Intel Random Number Generator," A Mathematical Theory of Communication, The Bell System Technical Journal, Vo. 27., pp. 379-423, Jul. 1948.

(Continued)

*Primary Examiner* — David H Malzahn
(74) *Attorney, Agent, or Firm* — F. Chau & Associates, LLC

(57) ABSTRACT

A random number generator includes a first oscillator configured to output a first oscillating signal having a first frequency. A second oscillator is configured to output a second oscillating signal having a second frequency different from the first frequency. A sampling unit is configured to receive the first and second oscillating signals. The sampling unit is configured to generate at least one entropy source by combining the received first and second oscillating signals. The sampling unit is configured to generate a random bit corresponding to the generated entropy source using a third oscillating signal. A third oscillator & control unit is configured to control the first and second oscillators and to generate the third oscillating signal. A frequency of the third oscillating signal is lower than the first and second frequencies.

18 Claims, 9 Drawing Sheets

(56) References Cited

U.S. PATENT DOCUMENTS

| | | | | |
|---|---|---|---|---|
| 2014/0237011 A1* | 8/2014 | Sackett | ............... | G06F 7/588 708/250 |
| 2014/0250160 A1* | 9/2014 | Ihor | ............... | G06F 7/588 708/251 |
| 2014/0280413 A1* | 9/2014 | Lewis | ............... | G06F 7/588 708/251 |
| 2014/0351305 A1* | 11/2014 | Hamilton | ............... | G06F 7/588 708/251 |

OTHER PUBLICATIONS

R.C. Fairfield, et al., "An LSI Random Number Generator (RNG)," Advances in Cryptology, CRYPTO '84, LNCS 196, pp. 203-230, 1985.

* cited by examiner

RANDOM NUMBER GENERATOR

CROSS-REFERENCE TO RELATED APPLICATIONS

This U.S. non-provisional patent application claims priority under 35 U.S.C. §119 to Korean Patent Application No. 10-2013-0022851, filed on Mar. 4, 2013, the disclosure of which is incorporated by reference herein in its entirety.

TECHNICAL FIELD

Exemplary embodiments of the present inventive concept relate to generating random numbers, and more specifically, to a random number generator.

DISCUSSION OF RELATED ART

Random numbers are used in various fields. For example, a random number may be used as a secret key of a security system. A random number generator generates a random number having an unpredictable value.

A true random number ("TRN") may be generated using a ring oscillator.

SUMMARY

An exemplary embodiment of the inventive concept provides a random number generator. The random number generator may include a first oscillator. The first oscillator outputs a first oscillating signal. The first oscillating signal has a first frequency. A second oscillator outputs a second oscillating signal. The second oscillating signal has a second frequency different from the first frequency. A sampling unit receives the first and second oscillating signals. The sampling unit generates at least one entropy source by combining the received first and second oscillating signals. The sampling unit samples a bit corresponding to the generated entropy source using a third oscillating signal. A third oscillator & control unit controls the first and second oscillators and generates the third oscillating signal. A frequency of the third oscillating signal is lower than the first and second frequencies.

An exemplary embodiment of the inventive concept also provides a random number generator. The random number generator may include a first oscillator. The first oscillator generates a first oscillating signal. The first oscillating signal has a first frequency. At least one second oscillator generates a second oscillating signal. The second oscillating signal has a second frequency lower than the first frequency. A sampling unit performs first sampling operations to generate at least two entropy sources using the first and second oscillating signals. The sampling unit performs a logical operation on a result of the first sampling operations. The sampling unit performs a second sampling operation on a result of the logical operation in response to a third oscillating signal. A third oscillator & control unit controls the first and second oscillators and generates the third oscillating signal.

An exemplary embodiment of the inventive concept provides an random number generator. The random number generator includes a first oscillator configured to output a first oscillating signal having a first frequency. A second oscillator is configured to output a second oscillating signal having a second frequency different from the first frequency. The second oscillating signal includes an entropy source. A third oscillator & control unit is configured to control the first and second oscillators and to generate a third oscillating signal different from the first and second frequencies. A sampling unit is configured to generate a random bit by sampling the first oscillating signal using the second oscillating signal and sampling the sampled first oscillating signal using the third oscillating signal.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Exemplary embodiments of inventive concept will be described more fully hereinafter with reference to the accompanying drawings. This inventive concept may, however, be embodied in many different forms and should not be construed as limited to the embodiments set forth herein. Like numbers may refer to like or similar elements throughout the specification and the drawings. It will be understood that when an element or layer is referred to as being "on," "connected to," "coupled to," or "adjacent to" another element or layer, it can be directly on, connected, coupled, or adjacent to the other element or layer, or intervening elements or layers may be present. As used herein, the singular forms "a," "an," and "the" are intended to include the plural forms as well, unless the context clearly indicates otherwise.

Figure 1:
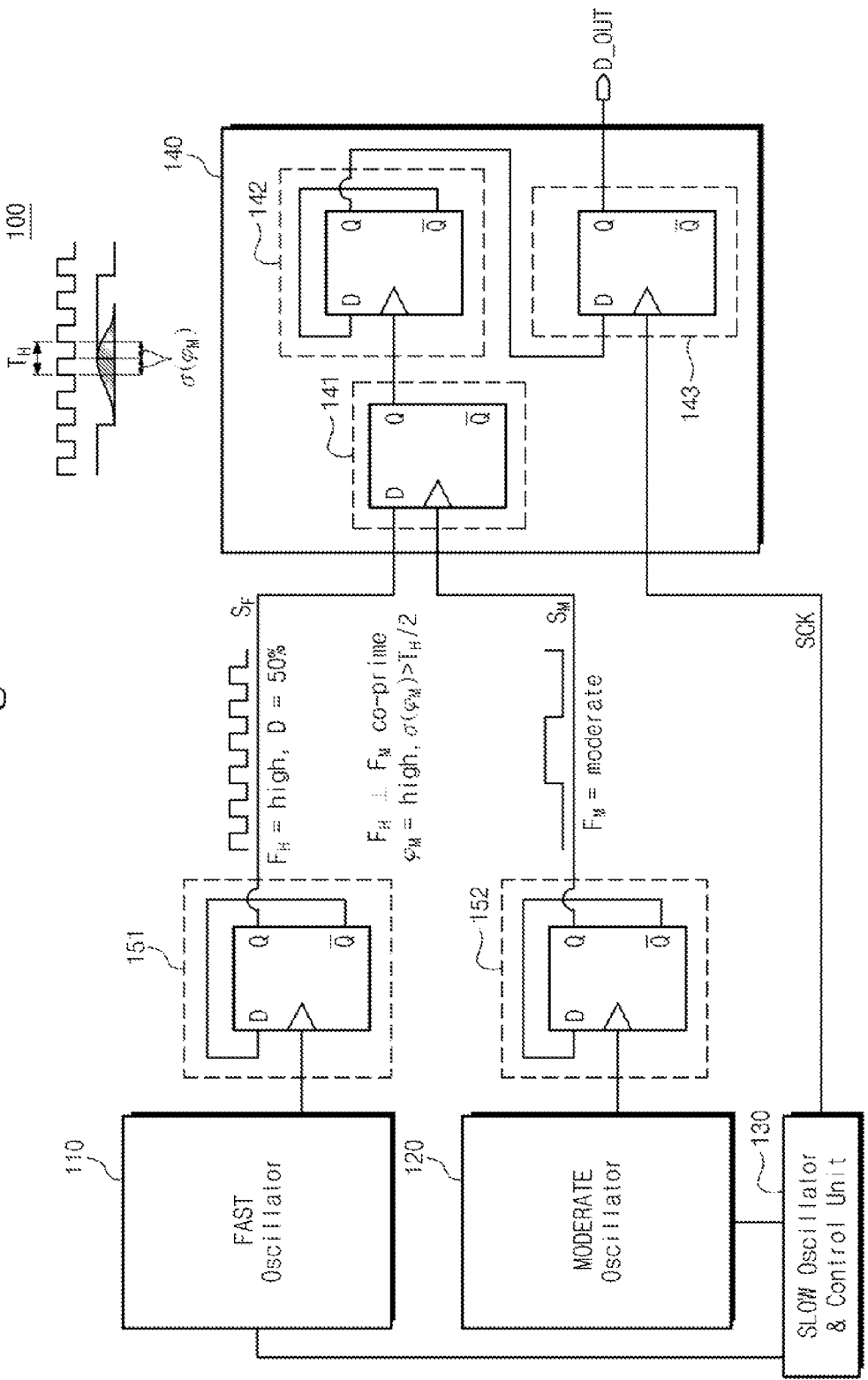
FIG. 1 is a view illustrating a random number generator in accordance with an exemplary embodiment of the inventive concept.

FIG. 1 is a view illustrating a random number generator in accordance with an exemplary embodiment of the inventive concept. Referring to FIG. 1, the random number generator 100 includes a first oscillator 110, a second oscillator 120, a third oscillator & control unit 130, a sampling unit 140, and first and second duty cycle calibration instruments 151 and 152.

The first oscillator 110 is a high speed oscillator and outputs a first oscillating signal $S_F$ (or 'high speed signal') that is equivalently distributed. The first oscillating signal $S_F$ may have a cyclic pattern of 1's and 0's for sampling. The probability (Pr(1)) in which 1's are included in a sampled pattern may be equal to the probability (Pr(0)) in which 0's are included in the sampled pattern, and thus, an equivalently distributed random number may be obtained. For example, Pr(1)=Pr(0)=0.5. Pr(1) is directly proportional to a duty cycle of a signal generated. For example, Pr(1)∝D. Here, D is a duty cycle. Thus, the duty cycle D becomes 50%.

A frequency $F_H$ of the first oscillating signal $S_F$ is a limitation on the performance of generating a random number. The frequency $F_H$ may be set as high as possible.

The second oscillator 120 is a moderate speed oscillator and is a main source of entropy. The second oscillator 120 outputs a second oscillating signal $S_M$ (or 'moderate speed signal'). A phase standard deviation of the second oscillating signal $S_M$ satisfies $$\sigma(\varphi_M) > \frac{T_H}{2}.$$

Here, $T_H$ is a period of the first oscillating signal $S_F$. A frequency $F_M$ of the second oscillator 120 is selected to sufficiently accumulate entropy.

The frequency $F_H$ of the first oscillator 110 and the frequency $F_M$ of the second oscillator 120 may be selected as co-prime to minimize a chance of "locking" of the first and second oscillators 110 and 120. A value of duty cycle D of the second oscillator 120 is an arbitrary value.

The third oscillator (which is a low speed oscillator) & control unit 130 controls the first and second oscillators 110 and 120 and outputs a sampling clock SCK (or 'a third oscillating signal,' or 'a low speed signal') to the sampling unit 140. A frequency of the sampling clock SCK is lower than the frequency $F_H$ of the first oscillator 110 and the frequency $F_M$ of the second oscillator 120. The third oscillator & control unit 130 provides a sampling clock SCK so that the sampling of the high speed oscillator 110 is synchronized by the moderate speed oscillator 120 having a target frequency to provide high flexibility of the random number generator 100 for different types of usage (e.g., for achieving high entropy, high performance, or low power).

The third oscillator & control unit 130 controls operations of the first and second oscillators 110 and 120. The first oscillator 110 may be reset to a predetermined value for generating an arbitrary bit. The third oscillator & control unit 130 can generate an activation signal EN which is regularly changed between an active mode and an inactive mode.

The sampling unit 140 receives the first oscillating signal $S_F$, the second oscillating signal $S_M$, and the sampling clock SCK, and outputs a random bit corresponding to an entropy source being output from the second oscillator 120 through an output stage D_OUT. The sampling unit 140 outputs a random bit generated by the high speed oscillator 110, the moderate speed oscillator 120, and the low speed oscillator 130. The sampling unit 140 includes a first sampling unit 141 (or 'free sampling unit'), a second mode counter 142, and a second sampling unit 143 (or 'master sampling unit,' or 'main sampling unit').

The first sampling unit 141 outputs entropy corresponding to a phase difference ($\Delta\phi=\phi_H-\phi_M$) between the first oscillator 110 and the second oscillator 120. When the phase difference $\Delta\phi$ is relatively great, for example, $\sigma(\phi_M) > T_H/2$, from the viewpoint of a period of the first oscillator 110, a sufficient entropy can be sampled regardless of a location of a sampling pulse (e.g., the second oscillating signal $S_M$).

The second mode counter 142 performs a counting operation that allows entropy to be accumulated whenever an output of the first sampling unit 141 is changed. Thus, more entropy is compressed as compared with an initial value.

The second sampling unit 143 samples an output value of the second mode counter 142 in response to the sample clock SCK (or 'third oscillating signal,' or 'a low speed signal').

The first duty cycle calibration instrument 151 calibrates a duty cycle of the first oscillating signal $S_F$ output from the first oscillator 110. The first duty cycle calibration instrument 151 may be embodied by a D-Q flip-flop as illustrated in FIG. 1.

The second duty cycle calibration instrument 152 calibrates a duty cycle of the second oscillating signal $S_M$ output from the second oscillator 120. The second duty cycle calibration instrument 152 may be embodied by a D-Q flip-flop as illustrated in FIG. 1.

The first and second duty cycle calibration instruments 151 and/or 152 may be omitted.

The random number generator 100 in accordance with an exemplary embodiment of the inventive concept can generate an entropy source by combining the high speed signal $S_F$ having an equivalent distribution, which is output from the first oscillator 110, with the moderate speed signal $S_M$ having a high jitter, which is output from the second oscillator 120 to generate an entropy source. Accordingly, the random number generator may generate a random number that has a high entropy and that is equivalently distributed.

Figure 2:
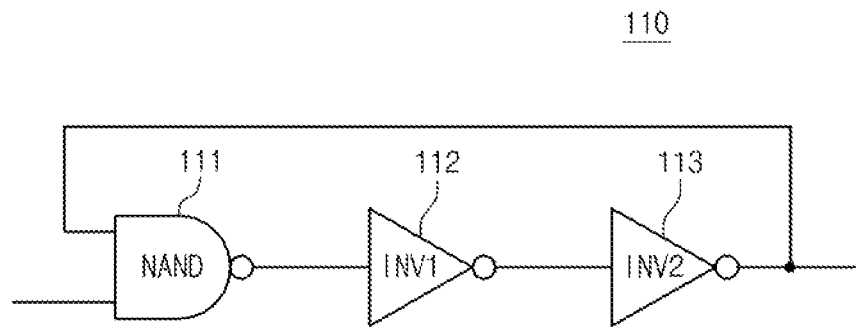
FIG. 2 is a view illustrating a first oscillator illustrated in FIG. 1, according to an exemplary embodiment of the inventive concept.

FIG. 2 is a view illustrating an embodiment of a first oscillator illustrated in FIG. 1, according to an exemplary embodiment of the inventive concept. Referring to FIG. 2, the first oscillator 110 includes a NAND logic circuit 111, a first inverter 112 and a second inverter 113. The NAND logic circuit 111 performs a NAND operation between an input signal and a feedback output signal. The first inverter 112 inverts an output of the NAND logic circuit 111, and the second inverter 113 inverts an output of the first inverter 112. The first oscillating signal $S_F$ is generated by a ring oscillator. The first oscillator 110 is not limited to the structure illustrated in FIG. 2. The first oscillator 110 may be embodied by various types of ring oscillators for generating the first oscillating signal $S_F$.

The second oscillator 120 for generating a main source of entropy can be embodied by a meta-oscillator.

Figure 3:
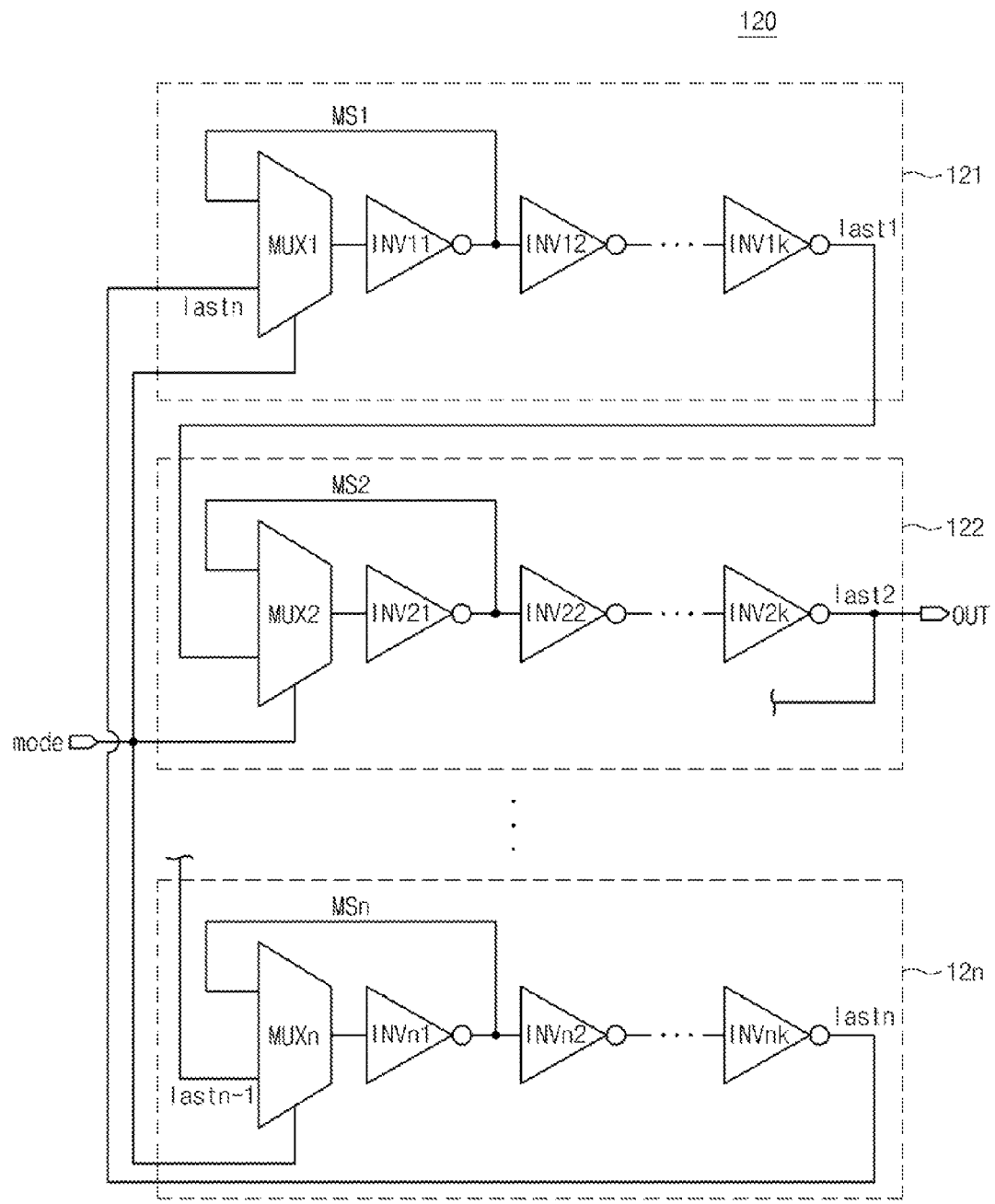
FIG. 3 is a view illustrating a second oscillator illustrated in FIG. 1, according to an exemplary embodiment of the inventive concept.

FIG. 3 is a view illustrating a second oscillator illustrated in FIG. 1, according to an exemplary embodiment of the inventive concept. Referring to FIG. 3, the second oscillator 120 includes a plurality of oscillating units 121 to 12n (n is an integer more than 2). The second oscillator 120 may be a meta-oscillator. Each of the oscillator units 121 to 12n includes switching devices serially connected to each other and a plurality of inverters.

The second oscillator 120 operates in one of a meta-stability mode and an oscillation mode according to a mode signal.

In the meta-stability mode, inverters INV11 to INVn1 are rendered to converge into a meta-stability level by switch devices MUX1 to MUXn. n entropy sources for providing statistically analog signals are generated. The generated entropy sources are connected to an amplification chain constituted by inverters serially connected to each other. For example, the inverters INV12 to INV1k form a first amplification chain, and the inverters INV22 to INV2k form a second amplification chain. The number (k) of inverters being used in each amplification chain may depend on a gain value of one inverter of the amplification chain. k may be also selected that allows a statistical analog signal in a targeted technique to be sufficiently amplified.

The number (n) of entropy sources depends on variation and discrepancy characteristics of a targeted technology process. n may be also calculated to allow a mean value of statistical analog signals of the entropy sources to have a sufficiently high chance of being consistent with a threshold level of the first inverter from a corresponding amplification chain. In each amplification chain, a discrepancy in a threshold level between the first inverter and a next inverter may be neglected. However, in another technology, the discrepancy might not be neglected but may be reflected.

The switch devices MUX1 to MUXn are converted, forming a ring oscillator in response to a mode signal. As illustrated in FIG. 3, the ring oscillator may include MUX1→INV11→INV12→ . . . →INV1k→MUX2→INV21→INV22 . . . →MUXn→INVn1→ . . . INVnk→MUX1. An odd number of inverters are needed to form the ring oscillator. After conversion, the second oscillator 120 generates an oscillating signal having a determined moderate speed frequency $F_M$ and an arbitrary phase $\phi_M$.

A value of the moderate speed frequency $F_M$ is defined by characteristics of CMOS inverters, and the value of the moderate speed frequency $F_M$ depends on characteristics of manufacturing technology. A value of the arbitrary phase $\phi_M$ is determined by momentum values of oscillating signals from corresponding inverters forming an oscillator before an oscillation mode. The momentum values of the oscillating signals are formed by statistical analog signals, and the momentum values have arbitrariness and entropy. Thus, the initial phase value $\phi_M$ is arbitrary. When an initial entropy is not sufficiently high, the random number generator 100 continuously operates in an oscillating mode for accumulating additional entropy from jitter.

The second oscillator 120 illustrated in FIG. 3 is merely an example. The second oscillator 120 can realize a meta-oscillator using various methods.

The random number generator 100 illustrated in FIG. 1 generates a random bit by sampling a bit corresponding to an entropy source in response to the sampling clock SCK. However, exemplary embodiments of the inventive concept are not limited as necessarily sampling a bit in response to the sampling clock SCK. The random number generator in accordance with an exemplary embodiment of the inventive concept can add entropy that makes the second oscillating signal $S_M$ sampled at a specific time by sampling the second oscillating signal $S_M$ used as the sampling clock SCK and a main entropy source according to a combination signal.

Figure 4:
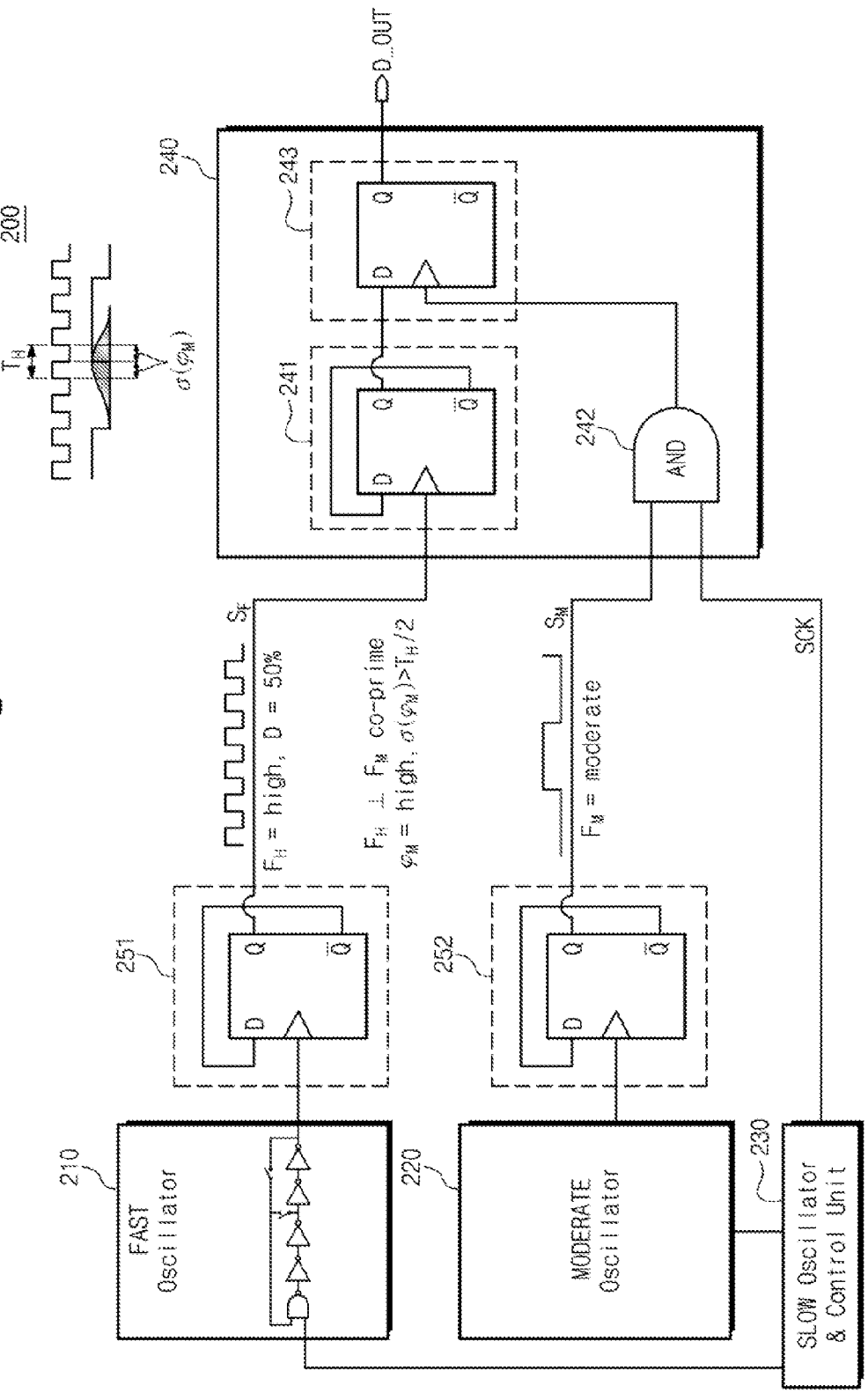
FIG. 4 is a view illustrating a random number generator in accordance with an exemplary embodiment of the inventive concept.

FIG. 4 is a view illustrating a random number generator in accordance with an exemplary embodiment of the inventive concept. Referring to FIG. 4, the random number generator 200 includes a first oscillator 210, a second oscillator 220, a third oscillator & control unit 230, a sampling unit 240 and first and second duty cycle calibration instruments 251 and 252.

The first oscillator 210, as compared with the first oscillator 110 illustrated in FIG. 2, can change a frequency of the first oscillating signal $S_F$. More entropy may be obtained by controlling a frequency of the first oscillator 210 to select a predetermined value which is suited for an initial step and frequency of the second oscillator 220.

The sampling unit 240 includes a counter 241, an AND logic circuit 242, and a master sampling unit 243. The counter 241 accumulates the remainder of the number of periods of the high speed oscillator 210. The master sampling unit 243 samples a value according to a constitution of a sampling clock SCK. The AND logic circuit 242 provides entropy for performing a sampling operation at a specific moment.

A duty cycle of the second oscillator 220 (e.g., a moderate speed oscillator) is as small as possible.

The random number generator 200 can generate entropy of a clock for a sampling operation by sampling a random bit using a sampling clock SCK and a second oscillating signal $S_M$.

The sampling unit 140 of FIG. 1 samples the first oscillating signal $S_F$ which is a high speed signal in response to the second oscillating signal $S_M$. However, exemplary embodiments of the inventive concept are not limited thereto. Alternatively, the sampling unit 140 can sample the second oscillating signal $S_M$ which is a moderate speed signal in response to the first oscillating signal $S_F$. For example, the first and second oscillators 110 and 120 may be reversed in light of their functions.

Figure 5:
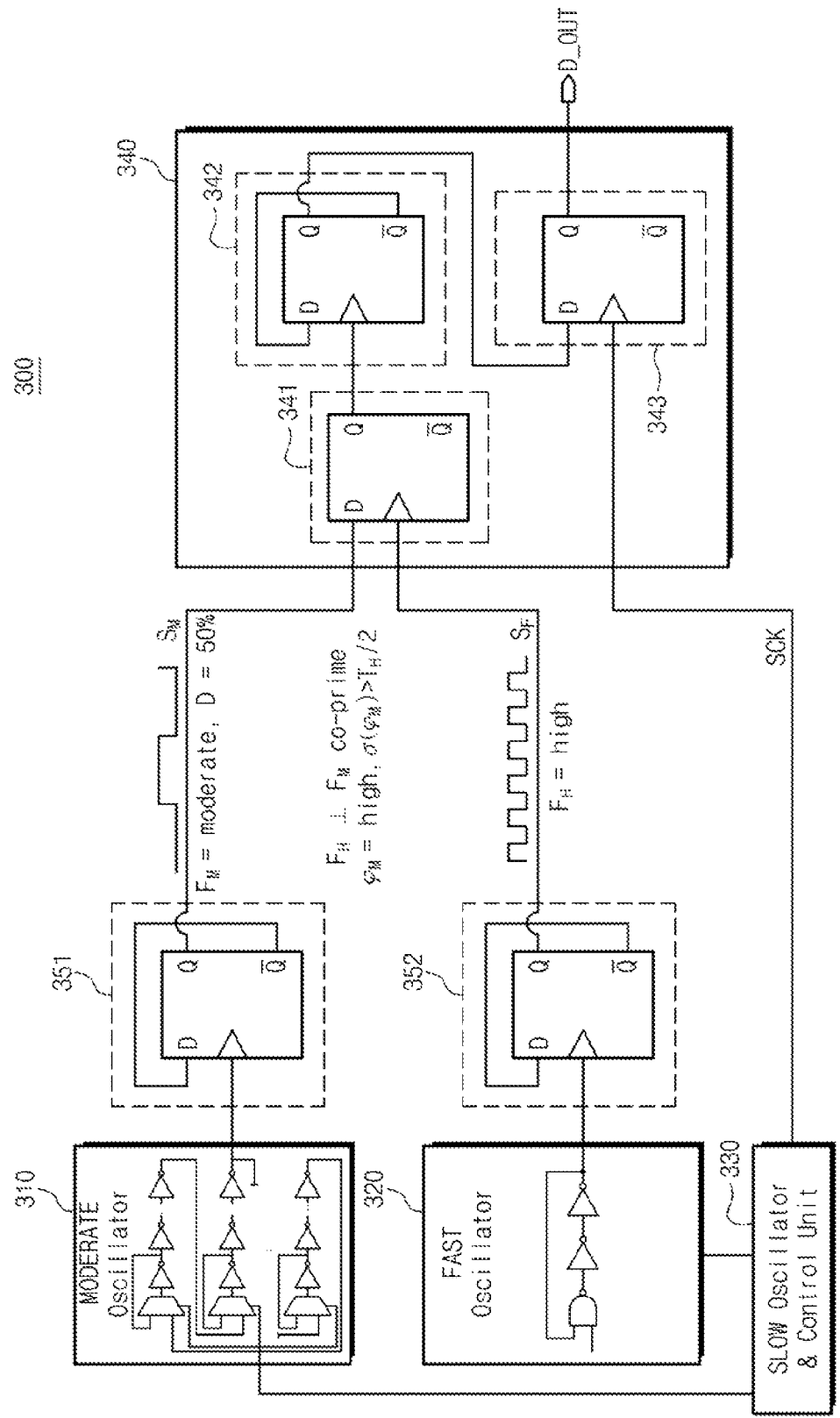
FIG. 5 is a view illustrating a random number generator in accordance with an exemplary embodiment of the inventive concept.

FIG. 5 is a view illustrating a random number generator in accordance with an exemplary embodiment of the inventive concept. Referring to FIG. 5, the random number generator 300 includes a first oscillator 310, a second oscillator 320, a third oscillator & control unit 330, a sampling unit 340 and first and second duty cycle calibration instruments 351 and 352. The first oscillator 310 may be substantially the same as the second oscillator 120 illustrated in FIG. 3, and the second oscillator 320 may be substantially the same as the first oscillator 110 illustrated in FIG. 2. For example, the first oscillator 310 is a moderate speed oscillator, and the second oscillator 320 is a high speed oscillator.

A signal of the first oscillator 310 is sampled at every rise of the second oscillator 320. A duty cycle of the second oscillator 320 may be arbitrary. However, a duty cycle D of the first oscillator 310 has to be 50%.

The random number generator 300 in accordance with an exemplary embodiment of the inventive concept can sample the moderate speed signal $S_M$ in response to the high speed signal $S_F$.

As shown in FIGS. 1 through 5, a random bit corresponding to one entropy source is generated using the high speed signal $S_F$ and the moderate speed signal $S_M$. However, exemplary embodiments of the inventive concept are not limited thereto. According to an exemplary embodiment of the inventive concept, a plurality of entropy sources may be generated using the high speed signal $S_F$ and the moderate speed signal $S_M$, and one of the generated entropy sources may be selected.

Figure 6:
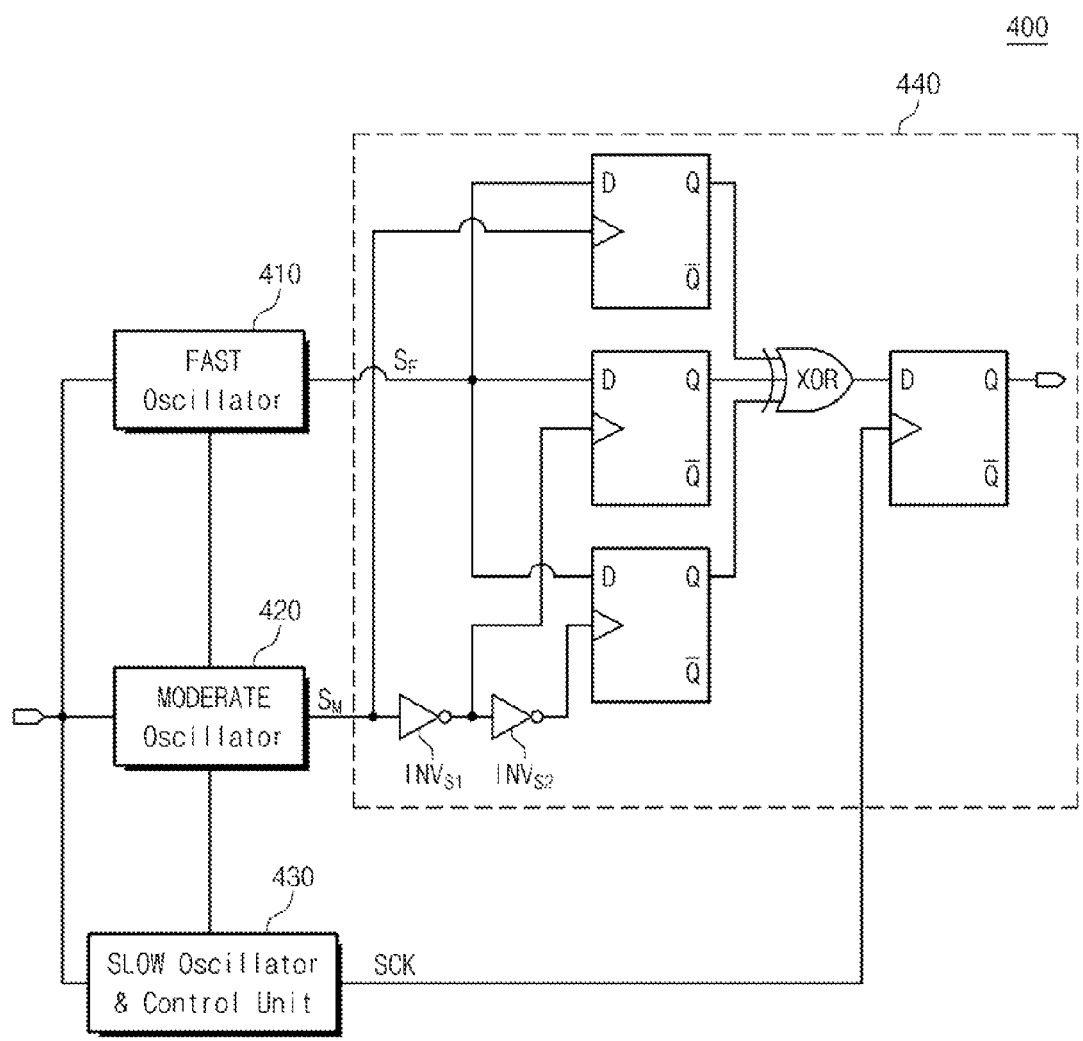
FIG. 6 is a view illustrating a random number generator in accordance with an exemplary embodiment of the inventive concept.

FIG. 6 is a view illustrating a fourth embodiment of a random number generator 400 in accordance with some embodiments of the inventive concept. Referring to FIG. 6, a high speed signal $S_F$ of a first oscillator 410 is sampled by signals obtained by delaying several times moderate speed signals $S_M$ of a second oscillator 420. Therefore, a chance of sampling an oscillating signal $S_F$ of the first oscillator 410 near variations of 1→0 and 0→1 may be increased. Accordingly, entropy may increase.

The random number generator 400 performs a first sampling operation (or a pre-sampling) on the high speed signal $S_F$ in response to the moderate speed signal $S_M$ and at least one of delayed moderate speed signals $S_M$. The random number generator 400 selects one of the first sampled result values and performs a second sampling operation (or a main sampling) on the selected value in response to a sampling clock SCK which is a low speed signal.

In FIG. 6, one moderate speed signal $S_M$ is delayed, obtaining a plurality of entropy sources. However, exemplary embodiments of the inventive concept are not limited thereto. To obtain a plurality of entropy sources, according to an exemplary embodiment of the inventive concept, a plurality of moderate speed signals $S_M$ may be generated using a plurality of moderate speed oscillators.

Figure 7:
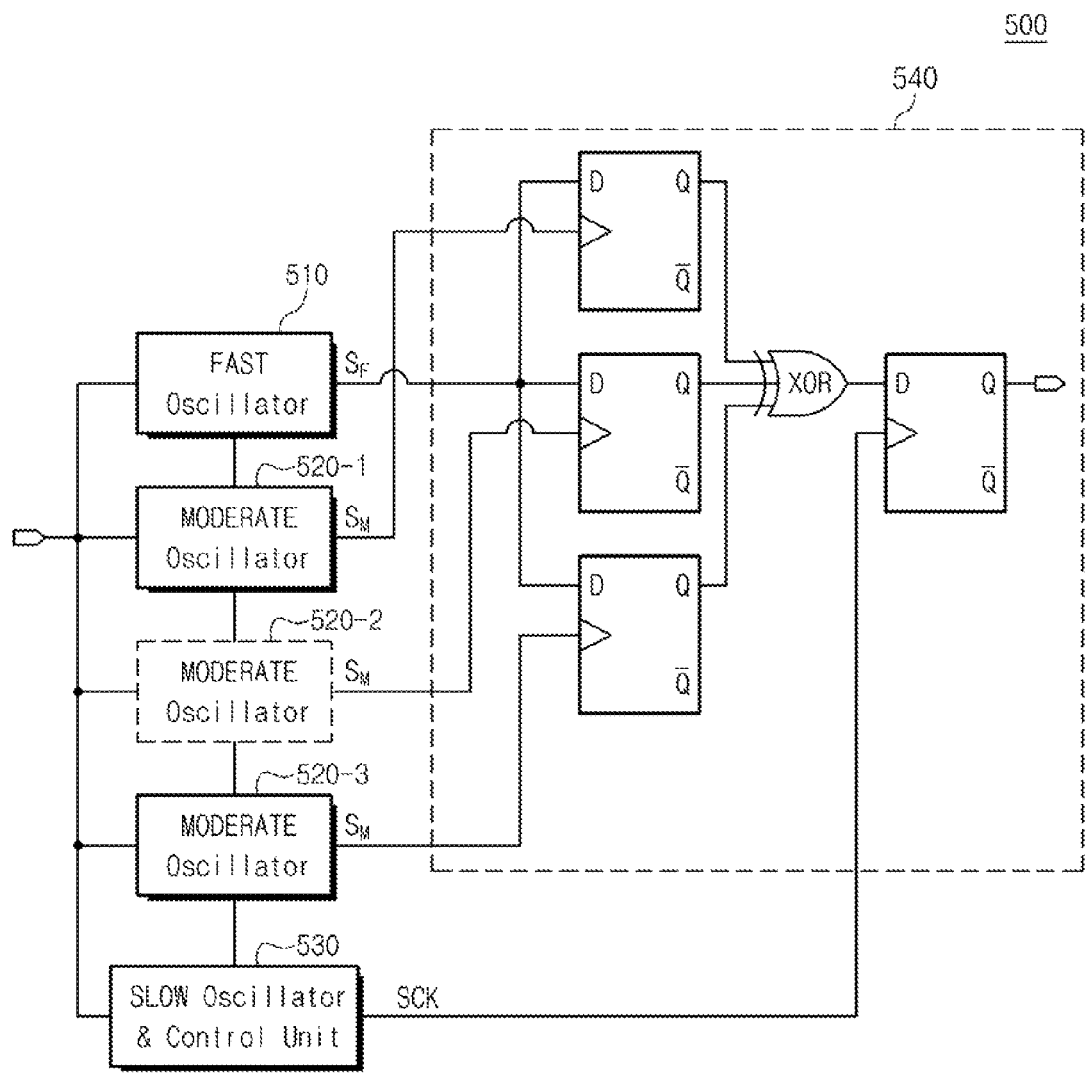
FIG. 7 is a view illustrating a random number generator in accordance with an exemplary embodiment of the inventive concept.

FIG. 7 is a view illustrating a random number generator 500 in accordance with an exemplary embodiment of the inventive concept. Referring to FIG. 7, a plurality of second oscillators 520_1, 520_2 and 520_3 having high jitter induce high entropy by sampling equivalently distributed oscillating signals $S_F$ of a first oscillator 510. Frequencies of the second oscillators (moderate speed oscillators) 520_1, 520_2 and 520_3 may be selected as co-prime. The use of the second oscillators 520_1, 520_2 and 520_3 can increase the quality of generated random numbers by increasing a chance of sampling an oscillating signal $S_F$ of a first oscillator 510 near variations of 1→0 and 0→1.

Referring to FIGS. 1 through 7, one random number bit is output. However, the random number generator according to an exemplary embodiment of the inventive concept is not limited thereto. Alternatively, the random number generator can output a plurality of random number bits.

Figure 8:
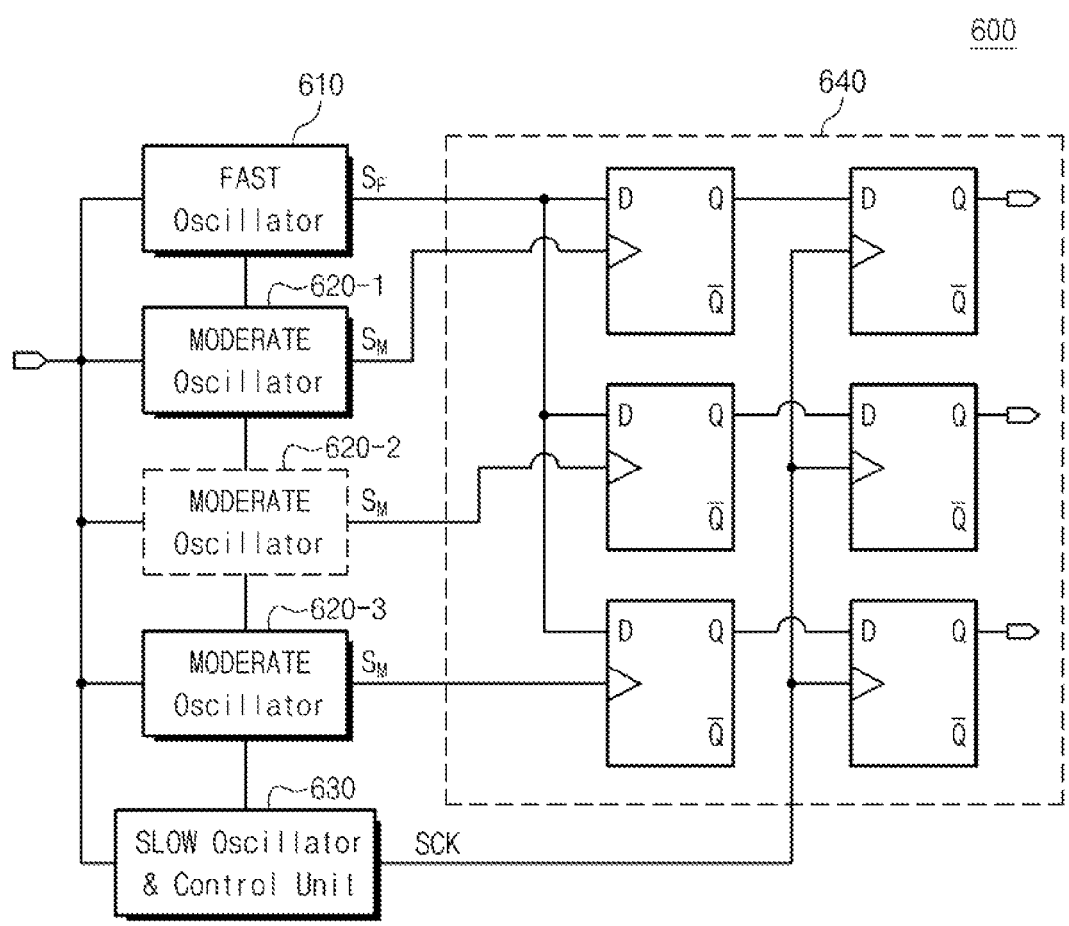
FIG. 8 is a view illustrating a random number generator in accordance with an exemplary embodiment of the inventive concept.

FIG. 8 is a view illustrating a random number generator 600 in accordance with an exemplary embodiment of the inventive concept. Referring to FIG. 8, the random number generator 600 is similar to the random number generator 500 illustrated in FIG. 7 except that an exclusive OR operation is performed on outputs of the moderate speed oscillators 520_1, 520_2 and 520_3. The random number generator 600 outputs values sampled in parallel.

When all of the phase values of moderate speed oscillators 620_1, 620_2 and 620_3 are arbitrary and independent from each other, values of parallel bits generated last are arbitrary and independent from each other. Thus, the performance of the random number generator is increased.

Figure 9:
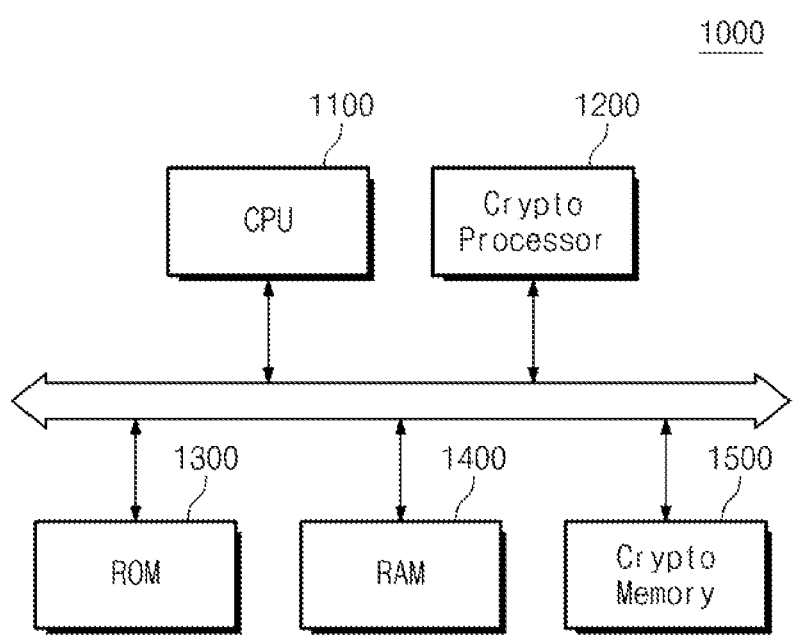
FIG. 9 is a block diagram illustrating a security system including a crypto processor having a random number generator in accordance with an exemplary embodiment of the inventive concept.

FIG. 9 is a block diagram illustrating a security system 1000 including a crypto processor having a random number generator in accordance with an exemplary embodiment of the inventive concept. Referring to FIG. 9, the security system 1000 includes a central processing unit 1100, a crypto processor 1200, a ROM 1300, a RAM 1400, and a memory 1500 for the crypto processor 1200.

The central processing unit 1100 controls an overall operation of the security system 1000. The crypto processor 1200 decodes a command for performing a cryptographic process, certification and electronic signature and processes data under the control of the central processing unit 1100. The crypto processor 1200 includes a random number generator as described above in connection with FIGS. 1 through 8. The ROM 1300 and the RAM 1400 store data for driving the security system 1000. The memory 1500 stores data for driving the crypto processor 1200.

The random number generator in accordance with an exemplary embodiment of the inventive concept may generate an entropy source by combining a high speed oscillating signal and a moderate speed oscillating signal to generate an entropy source. Accordingly, the random number generator may effectively generate a random number having an equivalent distribution While the inventive concept has been shown and described with reference to exemplary embodiments thereof, it will be apparent to those of ordinary skill in the art that various changes in form and detail may be made thereto without departing from the spirit and scope of the inventive concept as defined by the following claims.

What is claimed is:

1. A random number generator, comprising:
   a first oscillator configured to output a first oscillating signal having a first frequency;
   a second oscillator configured to output a second oscillating signal having a second frequency different from the first frequency;
   a third oscillator & control unit configured to control the first and second oscillators and to generate a third oscillating signal; and
   a sampling unit configured to receive the first and second oscillating signals, to generate at least one first entropy source by combining the received first and second oscillating signals and to generate a random bit corresponding to the generated first entropy source by sampling the first entropy source using the third oscillating signal,
   wherein a frequency of the third oscillating signal is lower than the first and second frequencies.

2. The random number generator of claim 1, wherein the first oscillating signal and the second oscillating signal are co-prime.

3. The random number generator of claim 1, wherein the first frequency is higher than the second frequency.

4. The random number generator of claim 3, wherein the first oscillating signal is a relatively high speed signal having an equivalent distribution.

5. The random number generator of claim 4, wherein the high speed signal has a duty cycle of about 50%.

6. The random number generator of claim 3, wherein the second oscillating signal is a moderate speed signal having high jitter.

7. The random number generator of claim 6, wherein a standard deviation of a phase of the moderate speed signal is greater than a half of a period of the first oscillating signal.

8. The random number generator of claim 3, wherein the first oscillator comprises:
   a NAND logic circuit configured to perform a NAND operation between an initial signal and the first oscillating signal;
   a first inverter configured to invert an output of the NAND logic circuit; and
   a second inverter configured to output the first oscillating signal by inverting an output of the first inverter.

9. The random number generator of claim 3, wherein the second oscillator is configured to generate a second entropy source in a meta-stability mode, the second oscillator comprising a plurality of oscillating parts configured to amplify the generated second entropy source, and wherein the second oscillator constitutes a ring oscillator by the oscillating parts in an oscillating mode.

10. The random number generator of claim 1, wherein the first frequency is lower than the second frequency.

11. The random number generator of claim 1, wherein the sampling unit comprises:
   a first sampling unit configured to sample the first oscillating signal in response to the second oscillating signal to generate the first entropy source;
   a second mode counter configured to count an output of the first sampling unit to accumulate the generated first entropy source; and
   a second sampling unit configured to sample an output of the second mode counter in response to the third oscillating signal to output the random bit.

12. The random number generator of claim 1, wherein the sampling unit comprises:
   a second mode counter configured to count the first oscillating signal;
   an AND logic circuit configured to perform an AND operation between the second oscillating signal and the third oscillating signal; and a master sampling unit configured to sample an output of the second mode counter in response to an output of the AND logic circuit.

13. The random number generator of claim 1, further comprising a duty cycle calibration instrument connected to an output of the first oscillator, the duty cycle calibration instrument configured to correct a duty cycle of the first oscillating signal.

14. A random number generator, comprising:
a first oscillator configured to generate a first oscillating signal having a first frequency;
at least one second oscillator configured to generate a second oscillating signal having a second frequency lower than the first frequency;
a sampling unit configured to perform first sampling operations to generate at least two entropy sources using the first and second oscillating signals, to perform a logical operation on a result of the first sampling operations and performing a second sampling operation on a result of the logical operation in response to a third oscillating signal; and
a third oscillator & control unit configured to control the first and second oscillators and to generate the third oscillating signal.

15. The random number generator of claim 14, wherein the logical operation is an exclusive OR operation.

16. A random number generator, comprising:
a first oscillator configured to output a first oscillating signal having a first frequency;
a second oscillator configured to output a second oscillating signal having a second frequency different from the first frequency, wherein the second oscillating signal includes an entropy source;
a third oscillator & control unit configured to control the first and second oscillators and to generate a third oscillating signal different from the first and second frequencies; and
a sampling unit configured to generate a random bit by sampling the first oscillating signal using the second oscillating signal and sampling the sampled first oscillating signal using the third oscillating signal.

17. The random number generator of claim 16, wherein the third oscillator & control unit is configured to delay the second oscillating signal at least once.

18. The random number generator of claim 16, further comprising at least one fourth oscillator having substantially the same structure as the second oscillator, the at least one fourth oscillator also providing the second oscillating signal to the sampling unit.

* * * * *